(12) United States Patent
Tatsumi (10) Patent No.: US 7,274,721 B2
(45) Date of Patent: Sep. 25, 2007

(54) MONOLITHIC MULTI-WAVELENGTH LASER DEVICE INCLUDING A PLURALITY OF LASING PARTS AND METHOD OF FABRICATING THE SAME

(75) Inventor: Masaki Tatsumi, Tenri (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 289 days.

(21) Appl. No.: 10/952,356

(22) Filed: Sep. 27, 2004

(65) Prior Publication Data
US 2005/0069006 A1    Mar. 31, 2005

(30) Foreign Application Priority Data
Sep. 30, 2003    (JP)    ............... 2003-339490

(51) Int. Cl.
*H01S 5/00*    (2006.01)
(52) U.S. Cl. .................. 372/50.1; 372/46.01
(58) Field of Classification Search ............ 372/45.01, 372/43.01, 75, 39, 46.01
See application file for complete search history.

(56) References Cited

U.S. PATENT DOCUMENTS

| | | | |
|---|---|---|---|
| 6,399,966 B1 * | 6/2002 | Tsuda et al. ............... 257/103 |
| 6,586,762 B2 * | 7/2003 | Kozaki ..................... 257/14 |
| 6,614,824 B2 * | 9/2003 | Tsuda et al. ............. 372/46.01 |
| 6,711,191 B1 * | 3/2004 | Kozaki et al. ........... 372/43.01 |
| 6,838,701 B2 * | 1/2005 | Sano ........................ 257/79 |
| 2004/0089873 A1 | 5/2004 | Morimoto et al. |
| 2004/0101014 A1 | 5/2004 | Ueda et al. |
| 2004/0124424 A1 | 7/2004 | Tatsumi |
| 2004/0233956 A1 * | 11/2004 | Sano ........................ 372/45 |

FOREIGN PATENT DOCUMENTS

| | | |
|---|---|---|
| JP | 01-204487 | 8/1989 |
| JP | 05-136526 | 6/1993 |
| JP | 2000-091698 | 3/2000 |
| JP | 2002-094181 | 3/2002 |

OTHER PUBLICATIONS

U.S. Appl. No. 10/891,507, filed Jul. 15, 2004, Wada et al.

* cited by examiner

*Primary Examiner*—Minsun Oh Harvey
*Assistant Examiner*—Tuan N. Nguyen
(74) *Attorney, Agent, or Firm*—Morrison & Foerster LLP (57) ABSTRACT

A monolithic multi-wavelength laser device according to the present invention comprises a substrate, a first-wavelength lasing part having a ridge portion and a second-wavelength lasing part having a ridge portion, while each of the first-wavelength lasing part and the second-wavelength lasing part includes current blocking layers consisting of semiconductor thin films covering the side surfaces of the ridge portion and extending toward at least partial regions of a plane linked with the bottom surface of the ridge portion and an insulation layer, covering the current blocking layers, consisting of an insulating dielectric thin film made of a material having a lower refractive index than the current blocking layers.

13 Claims, 5 Drawing Sheets

MONOLITHIC MULTI-WAVELENGTH LASER DEVICE INCLUDING A PLURALITY OF LASING PARTS AND METHOD OF FABRICATING THE SAME

This nonprovisional application is based on Japanese Patent Application No. 2003-339490 filed with the Japan Patent Office on Sep. 30, 2003, the entire contents of which are hereby incorporated by reference.

BACKGROUND OF THE INVENTION

1. Field of the Invention

The present invention relates to a laser device. More specifically, the present invention relates to a monolithic multi-wavelength laser device including a plurality of lasing parts formed on the same substrate.

The present invention also relates to a method of fabricating the aforementioned monolithic multi-wavelength laser device.

2. Description of the Background Art

An optical disk such as a CD (compact disk), a DVD (digital video disk) or an MD (Mini Disc) optically recording information is widely utilized as a large capacity recording medium at present.

The information is recorded in or reproduced from the optical disk through an optical pickup. A laser beam of the 780 nm waveband is employed for an optical pickup reproducing information from a CD while that of the 650 nm waveband is employed for an optical pickup reproducing information from a DVD, in response to the difference in recording density depending on the types of the optical disks.

In recent years, an optical disk capable of reproducing information from both of a CD and a DVD with an optical pickup having a multi-wavelength semiconductor laser device prepared by combining semiconductor laser devices having emission wavelengths of the 650 nm and 780 nm bands with each other has been developed in place of dedicated optical disks for individually reproducing information from the CD and the DVD respectively, as described in Japanese Patent Laying-Open No. 01-204487 or 2000-091698, for example.

Figure 6:
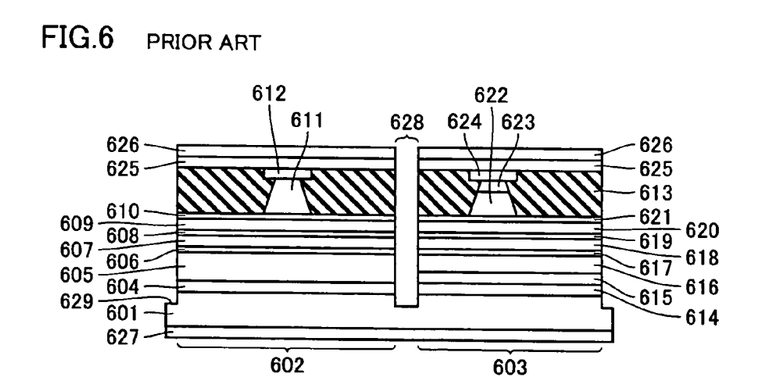
FIG. 6 is a schematic sectional view illustrating an exemplary conventional monolithic multi-wavelength laser device.

FIG. 6 is a schematic sectional view illustrating an exemplary conventional monolithic multi-wavelength laser device. Throughout the accompanying drawings, identical reference numerals denote the same or corresponding portions. Throughout the accompanying drawings, further, dimensions such as lengths, thicknesses and widths are properly changed and not in actual dimensional relation, for the purpose of clarifying and simplifying the illustration.

In the monolithic multi-wavelength laser device shown in FIG. 6, a CD lasing part 602 and a DVD lasing part 603 are parallely formed on an inclined n-type GaAs substrate 601 having a main surface offset by 15° from the crystallographic (001) plane in the [110] orientation.

An n-type GaAs buffer layer 604, an n-type $Al_{0.5}Ga_{0.5}As$ cladding layer 605, an undoped $Al_{0.3}Ga_{0.7}As$ guide layer 606, an active layer 607, another undoped $Al_{0.3}Ga_{0.7}As$ guide layer 608, a p-type $Al_{0.5}Ga_{0.5}As$ first cladding layer 609 and a p-type GaAs etching stopper layer 610 are successively formed on the CD lasing part 602. A ridge-shaped p-type $Al_{0.5}Ga_{0.5}As$ second cladding layer 611 and a p-type GaAs cap layer 612 are successively formed on the p-type GaAs etching stopper layer 610, and both side surfaces of the ridge-shaped p-type $Al_{0.5}Ga_{0.5}As$ second cladding layer 611 and a p-type GaAs cap layer 612 are filled up with n-type GaAs current blocking layers 613.

On the other hand, an n-type GaAs buffer layer 614, an n-type GaInP buffer layer 615, an n-type $(Al_{0.7}Ga_{0.3})_{0.5}In_{0.5}P$ cladding layer 616, an undoped $(Al_{0.5}Ga_{0.5})_{0.5}In_{0.5}P$ guide layer 617, an active layer 618, another undoped $(Al_{0.5}Ga_{0.5})_{0.5}In_{0.5}P$ guide layer 619, a p-type $(Al_{0.7}Ga_{O.3})_{0.5}In_{0.5}$ first cladding layer 620 and a p-type GaInP etching stopper layer 621 are successively formed on the DVD lasing part 603. A ridge-shaped p-type $(Al_{0.7}Ga_{0.3})_{0.5}In_{0.5}$ second cladding layer 622, a p-type GaInP intermediate layer 623 and a p-type GaAs cap layer 624 are successively formed on the p-type GaInP etching stopper layer 621, and both side surfaces of the ridge-shaped p-type $(Al_{0.7}Ga_{0.3})_{0.5}In_{0.5}$ second cladding layer 622, a p-type GaInP intermediate layer 623 and a p-type GaAs cap layer 624 are filled up with n-type GaAs current blocking layers 613.

P-side ohmic electrodes 625 and Mo/Au electrodes 626 are successively formed on the p-type GaAs cap layers 612 and 624 of the CD and DVD lasing parts 602 and 603 respectively. An n-side ohmic electrode 627 is formed on the back surface of the n-type GaAs substrate 601.

A lasing part isolation trench 628 reaching the substrate 601 is formed between the CD and DVD lasing parts 602 and 603, in order to electrically isolate these lasing parts 602 and 603 from each other. Each monolithic multi-wavelength laser device is divided from a wafer along chip dividing trenches 629.

The monolithic multi-wavelength laser device shown in FIG. 6 fabricated in the aforementioned manner is mounted on a submount. At this time, the side closer to the p-side ohmic electrodes 625 is mounted on the surface of the submount while directing that closer to the n-side ohmic electrode 627 upward, and the submount is attached onto a prescribed stem.

When sectionally observed, however, the aforementioned p-side ohmic electrodes 625 have large numbers of gaps around the heads of the ridge portions of the CD and DVD lasing parts 602 and 603, leading to inferior heat dissipativity. Further, the operating current of the monolithic multi-wavelength laser device including a loss guided structure utilizing the current blocking layers 613 of GaAs is increased due to large internal loss, to extremely narrow the tolerance for thermal design etc. in optical pickup design.

In recent years, a technique of growing an epitaxial layer having a lattice constant close to that of an upper cladding layer on the upper cladding layer for chemically stabilizing the upper cladding layer has been developed, as disclosed in Japanese Patent Laying-Open No. 2002-094181, for example. However, this optical confinement structure is still unsatisfactory in performance. Further, a large number of gaps are formed around the heads of ridge portions due to an air ridge structure, disadvantageously leading to inferior heat dissipativity.

While Japanese Patent Laying-Open No. 05-136526 describes a buried (BH) laser prepared by filling up the side surfaces of a waveguide consisting of a double heterostructure with current blocking layers, this buried laser has problems similar to the above, and is not a multi-wavelength laser device.

SUMMARY OF THE INVENTION

On the basis of the aforementioned circumstances, an object of the present invention is to provide a monolithic multi-wavelength laser device having high reliability, a low operating current, less return optical noise and high heat dissipativity.

Another object of the present invention is to provide a method of fabricating a monolithic multi-wavelength laser device capable of simply and correctly fabricating a monolithic multi-wavelength laser device having high reliability, a low operating current, less return optical noise and high heat dissipativity.

The inventor has conceived the idea that not the loss guided structure but a real guided structure may be employed for current blocking layers thereby reducing the operating current as well as the heating value while reducing return optical noise by some means in order to solve the aforementioned problems, and attempted development of a monolithic multi-wavelength laser device comprising this structure.

Consequently, the inventor has found that a monolithic multi-wavelength laser device having high reliability, a low operating current, less return optical noise and high heat dissipativity can be implemented by providing current blocking layers and an insulation layer having a low refractive index as layers for filling up the side surfaces of a ridge portion thereby reducing return optical noise and further providing an outer metal electrode layer on a p-side electrode thereby increasing heat dissipativity in addition to the employment of the real guided structure, and completed the present invention.

The monolithic multi-wavelength laser device according to the present invention comprises a substrate, a first-wavelength lasing part having a ridge portion and a second-wavelength lasing part having a ridge portion, while each of the first- and second-wavelength lasing parts includes current blocking layers consisting of semiconductor thin films covering the side surfaces of the aforementioned ridge portion and extending toward at least partial regions of a plane linked with the bottom surface of the aforementioned ridge portion and an insulation layer, covering the current blocking layers, consisting of an insulating dielectric thin film made of a material having a lower refractive index than the current blocking layers.

This monolithic multi-wavelength laser device preferably further comprises a p-side electrode including an inner metal electrode layer and an outer metal electrode layer, while the inner metal electrode layer is preferably in contact with part of the aforementioned insulation layer and the outer metal electrode layer preferably covers the aforementioned inner metal electrode layer.

The thickness of the current blocking layers may be in the range of 0.05 μm to 0.2 μm. Further, the surface of the insulation layer may have an O composition and/or an N composition in the range of 0 to 0.001 and a thickness in the range of 0.05 μm to 0.2 μm.

In addition, the current blocking layers may consist of semiconductor thin films containing at least one material selected from a group consisting of GaAs, α-Si and Ge. The inner metal electrode layer may cover the overall surface of the insulation layer in the laser beam emission direction.

Further, the insulation layer may be an insulating dielectric thin film containing at least one material selected from a group consisting a silicon oxide, a silicon nitride and a mixture of a silicon oxide and a silicon nitride as the material, and the surface of this insulation layer may have an O composition and/or an N composition in the range of 0 to 0.001.

The inner metal electrode layer may contain an Mo/Au alloy and/or a Ti/Al alloy as the material. On the other hand, the outer metal electrode layer may contain Au as the material.

The substrate may consist of a material including GaAs. Further, this substrate may have an offset angle in the range of 5 to 25° from the (001) plane in the [110] orientation.

The inventive method of fabricating the aforementioned monolithic multi-wavelength laser device comprises steps of forming the current blocking layers and forming the insulation layer at a film forming temperature in the range of 150 to 400° C., and can further comprise steps of forming the inner metal electrode layer and forming the outer metal electrode layer.

The step of forming the insulation layer may include a step of forming this insulation layer at a film forming temperature of 150 to 250° C. Further, the step of forming the outer metal electrode layer may include a step of forming this outer metal electrode layer by electrolytic plating.

The aforementioned method of fabricating the monolithic multi-wavelength laser device may further comprise steps of forming an etching stopper layer consisting of a semiconductor thin film containing GaAs as the material, forming a cladding layer consisting of a semiconductor thin film coming into contact with the side of this etching stopper layer closer to the p-side electrode and containing $Al_xGa_{1-x}As$ ($0.4 \leq x \leq 0.7$) as the material, forming a cap layer consisting of a semiconductor thin film coming into contact with the side of this cladding layer closer to the p-side electrode and containing GaAs as the material, selectively performing first etching on this cap layer with an etching solution containing ammonia to be stopped on the surface of the cladding layer closer to the p-side electrode and selectively performing second etching on the cladding layer with an etching solution containing hydroflucric acid to be stopped on the surface of the etching stopper layer closer to the p-side electrode, and the step of forming the current blocking layers may include a step of forming the current blocking layers to come into contact with the ridge portion(s) of the first-wavelength lasing part and/or the second-wavelength lasing part exposed through the steps of performing the first etching and the second etching.

According to the present invention, as described below, the current blocking layers consisting of thin GaAs layers or the like, the insulation layer consisting of an insulating dielectric thin film or the like etc. are formed on the side surfaces of the ridge portion of each of the CD and DVD lasing parts to fill up the ridge portion. Further, the inner metal electrode layer serving as the underlayer for the outer metal electrode layer covers the surfaces of prescribed portions such as those corresponding to the side surfaces of the ridge portion on the insulation layer consisting of an insulating dielectric thin film or the like. In addition, the outer metal electrode layer is formed on the inner metal electrode layer. According to the present invention, a monolithic multi-wavelength laser device capable of reducing an operating current by a real guided structure and improving heat dissipativity by the outer metal electrode layer along with excellent characteristics can be provided due to the aforementioned structure.

Accordingly, the monolithic multi-wavelength laser device according to the present invention has high reliability, a low operating current, less return optical noise and high heat dissipativity.

The method of fabricating a monolithic multi-wavelength laser device according to the present invention can simply and correctly fabricate a monolithic multi-wavelength laser device having high reliability, a low operating current, less return optical noise and high heat dissipativity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention is now described in more detail with reference to an embodiment.

<Monolithic Multi-Wavelength Laser Device>

Figure 1:
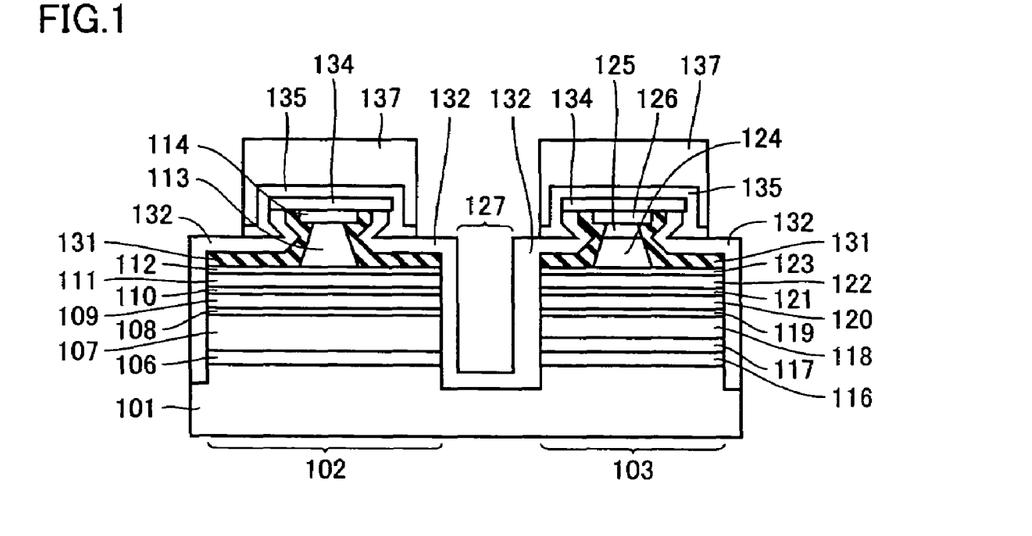
FIG. 1 is a schematic sectional view illustrating a monolithic multi-wavelength laser device according to an embodiment of the present invention.

FIG. 1 is a schematic sectional view illustrating a monolithic multi-wavelength laser device according to the embodiment.

As shown in FIG. 1, the monolithic multi-wavelength laser device according to the embodiment comprises a substrate 101, a first-wavelength lasing part 102 having a ridge portion and a second-wavelength lasing part 103 also having a ridge portion, while each of the first- and second-wavelength lasing parts 102 and 103 includes current blocking layers 131 consisting of semiconductor thin films covering the side surfaces of the ridge portion and extending toward at least partial regions of a plane linked with the bottom surface of the ridge portion and insulation layers 132, covering the current blocking layers 131, consisting of insulating dielectric thin films of a material having a lower refractive index than the current blocking layers 131.

The ridge portion of the first-wavelength lasing part 102 includes layers present on a p-type etching stopper layer 112, i.e., a p-type second cladding layer 113 and a p-type cap layer 114. The ridge portion of the second-wavelength lasing part 103 includes layers present on a p-type etching stopper layer 123, i.e., a p-type second cladding layer 124, a p-type intermediate layer 125 and a p-type cap layer 126.

The aforementioned plane linked with the bottom surface of the ridge portion is defined by the surface (formed with no ridge portion) of the aforementioned p-type etching stopper layer 112 in the first-wavelength lasing part 102. In the second-wavelength lasing part 103, this plane is defined by the surface (formed with no ridge portion) of the aforementioned p-type etching stopper layer 123. The current blocking layers 131, formed to entirely cover the plane linked with the bottom surface of the aforementioned ridge portion in each of the first- and second-wavelength lasing parts 102 and 103 in FIG. 1, may simply extend toward partial regions of the plane linked with the bottom surface of the ridge portion without entirely covering this plane.

The monolithic multi-wavelength laser device according to the embodiment also has p-side electrodes including inner metal electrode layers 135 and outer metal electrode layers 137, while the inner metal electrode layers 135 are partially in contact with the aforementioned insulation layers 132 and the outer metal electrode layers 137 cover the inner electrode layers 135.

In the monolithic multi-wavelength laser device according to the embodiment, the first- and second-wavelength lasing parts 102 and 103 formed on a single GaAs substrate, for example, have a real guided structure so that waveguide loss as well as an operating current can be reduced as compared with the prior art also when the first and second wavelengths are 780 nm and 650 nm bands respectively.

<Substrate>

The aforementioned substrate 101 preferably consists of a material containing GaAs. When the substrate 101 is made of this material, crystals consisting of a desired material can advantageously be flatly grown with excellent crystallinity.

The aforementioned substrate 101 preferably has an offset angle in the range of 5 to 25° from the (001) plane in the [110] orientation, in order to adjust the wavelength of the second-wavelength lasing part 103 and improve crystallinity of the first- and second-wavelength lasing parts 102 and 103 thereby improving the characteristics of the laser device. The offset angle is more preferably 10 to 20°, and further preferably 13 to 18°.

<Current Blocking Layer>

The thickness of the aforementioned current blocking layers 131 is preferably at least 0.05 µm, more preferably at least 0.1 µm in particular. This thickness is preferably not more than 0.2 µm, more preferably not more than 0.17 µm in particular. Transverse optical confinement along the ridge portions tends to be unstable to increase dispersion of optical characteristics if this thickness is less than 0.05 µm, while waveguide loss as well as the operating current tend to be increased if this thickness exceeds 0.2 µm.

The aforementioned current blocking layers 131 preferably consist of semiconductor thin films containing at least one material selected from a group consisting of GaAs, α-Si and Ge. When the current blocking layers 131 contain this material, adhesion between the insulating dielectric thin films and the side surfaces of the ridge portions as well as the etching stopper layers 112 and 123 is improved and the shape of the angle of horizontal radiation is stabilized due to weak optical absorption through the thin current blocking layers 131.

<Insulation Layer>

The aforementioned insulation layers 132 preferably consist of the insulating dielectric thin films coming into contact with the sides of the aforementioned current blocking layers 131 closer to the p-side electrodes and consisting of the material having a lower refractive index than that of the material for the current blocking layers 131, as hereinabove described. Transverse optical confinement along the ridge portions can be stabilized and waveguide loss can be reduced due to the refractive index of the insulation layers 132 lower than that of the current blocking layers 131.

The refractive index of the insulation layers 132 consisting of the aforementioned insulating dielectric thin films having the low refractive index is preferably in the range of 1.0 to 2.0. The refractive index of the material for the ridge portion of the first-wavelength lasing part 102 is generally in the range of 3.2 to 3.4, and hence the refractive index of the insulation layers 132 consisting of the insulating dielectric thin films is preferably smaller than those of the materials for the ridge portion and the aforementioned current blocking layers 131, in order to confine light in the lasing part 102. Silicon nitride, silicon oxide or a mixture thereof is selectable as the material for the insulation layers 132 consisting of the insulating dielectric thin films.

The surfaces of the insulation layers 132 consisting of the aforementioned insulating dielectric thin films preferably have an O composition and/or an N composition (including the total of N and O compositions) of at least 0, more preferably at least 0.00001 in particular. The O composition and/or the N composition is preferably not more than 0.001, more preferably not more than 0.0005 in particular. Thus, adhesion between the insulation layers 132 and the inner metal electrode layers 135 containing Mo/Au as the material is improved so that the outer metal electrode layers 137 containing Au as the material can be reliably formed.

Further, the thickness of the insulation layers 132 consisting of the aforementioned insulating dielectric thin films having the low refractive index is preferably at least 0.05 µm, more preferably 0.1 µm in particular. This thickness is preferably not more than 0.2 µm, more preferably not more than 0.15 µm in particular. When the insulation layers 132 consisting of insulating dielectric thin films having the low refractive index are formed also on the second-wavelength lasing part 103 in addition to the first-wavelength lasing part 102, the second-wavelength lasing part 103 can be prevented from reduction of temperature characteristics and reliability by reducing the thickness of the insulation layers 132 consisting of the insulating dielectric thin films having smaller thermal conductivity and inferior heat dissipativity than semiconductor crystals.

<Inner Metal Electrode Layer>

The aforementioned inner metal electrode layers 135 preferably entirely cover the aforementioned insulation layers 132 along the laser beam emission direction. According to this structure, the outer metal electrode layers 137 are formed on the overall surfaces of the inner metal electrode layers 135 for improving heat dissipation from the lasing parts 102 and 103 as well as the temperature characteristics and the reliability of the laser device.

The aforementioned inner metal electrode layers 135 preferably contain an Mo/Au alloy and/or a Ti/Al alloy as the material. When the inner metal electrode layers 135 contain this material, heat dissipativity of the laser device can be further improved due to the low thermal conductivity.

<Outer Metal Electrode Layer>

The aforementioned outer metal electrode layers 137 preferably contain Au as the material. In this case, the outer metal electrode layers 137 can be readily formed in a large thickness by electrolytic plating with excellent conformability to a brazing filler metal for mounting the laser device on a stem.

The thickness of the outer metal electrode layers 137 is preferably in the range of 2.5 to 3 µm, in view of protection of the ridge portions and heat dissipativity.

<Method of Fabricating Monolithic Multi-Wavelength Laser Device>

A method of fabricating the monolithic multi-wavelength laser device according to this embodiment comprises steps of forming the aforementioned current blocking layers 131 and forming the aforementioned insulation layers 132 at a film forming temperature in the range of 150 to 400° C., and can further comprise steps of forming the aforementioned inner metal electrode layers 135 and forming the aforementioned outer metal electrode layers 137.

In the method of fabricating the monolithic multi-wavelength laser device according to this embodiment, the film forming temperature in the step of forming the insulation layers 132 consisting of the insulating dielectric thin films having the low refractive index is preferably at least 150° C., more preferably at least 200° C. in particular. This film forming temperature is preferably not more than 400° C., more preferably not more than 250° C. in particular. Internal strain in the insulating dielectric thin films tends to increase to weaken adhesion between the same and the current blocking layers 131 and readily separate the insulating dielectric thin films due to temperature variation of the thermal history in an alloying step or the like resulting from influence by the difference between the thermal expansion coefficients of the insulation layers 132 and the current blocking layers 131 if the film forming temperature is less than 150° C., while the density and the hardness of the insulating dielectric thin films tend to increase to weaken adhesion between the same and the current blocking layers 131 and readily separate the insulating dielectric thin films due to influence by the difference between the thermal expansion coefficients of the insulation layers 132 and the current blocking layers 131 if the film forming temperature exceeds 400° C.

The step of forming the aforementioned outer metal electrode layers 137 preferably includes a step of forming the aforementioned outer metal electrode layers 137 by electrolytic plating. When electrolytic plating is employed, the outer metal electrode layers 137 can be readily formed with a prescribed thickness to be entirely formed on the inner metal electrode layers 135.

While the present invention is now described in more detail with reference to Examples, the present invention is not restricted to these Examples.

EXAMPLE 1

The schematic sectional view of FIG. 1 illustrates a monolithic two-wavelength semiconductor laser device according to Example 1 of the present invention.

FIGS. 2A to 5B are schematic sectional views illustrating an exemplary method of fabricating the monolithic two-wavelength semiconductor laser device shown in FIG. 1.

Figure 2A:
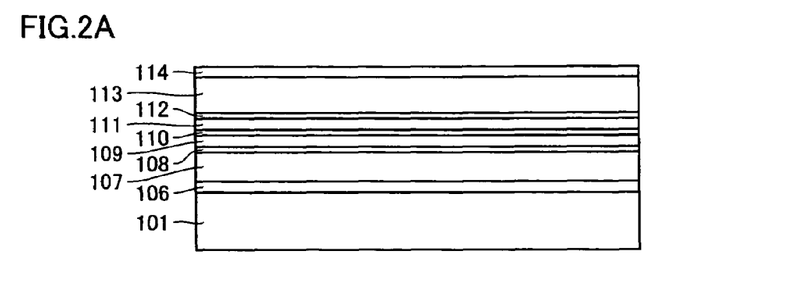
FIG. 2A, showing a step in an exemplary method of fabricating a monolithic multi-wavelength laser device according to the present invention, is a sectional view illustrating formation of a semiconductor multilayer structure for a CD lasing part, FIG. 2B, showing another step in the method of fabricating a monolithic multi-wavelength laser device according to the present invention, is a sectional view illustrating a part of the surface of a substrate exposed for forming a DVD lasing part.

As shown in FIG. 2A, a semiconductor multilayer structure for a first-wavelength lasing part (hereinafter also referred to as a CD lasing part) 102 is formed on an inclined n-type GaAs substrate 101 having a main surface inclined at an offset angle of 15° from the (001) plane in the [110] orientation by MOCVD (metal organic chemical vapor deposition). More specifically, an n-type GaAs buffer layer 106, an n-type $Al_{0.5}Ga_{0.5}As$ cladding layer 107, an n-type $Al_{0.3}Ga_{0.7}As$ guide layer 108, an active layer 109 consisting of an MQW (multiple quantum well) structure, a p-type $Al_{0.3}Ga_{0.7}As$ guide layer 110, a p-type $Al_{0.5}Ga_{0.5}As$ first cladding layer 111, a p-type GaAs etching stopper layer 112, a p-type $Al_{0.5}Ga_{0.5}As$ second cladding layer 113 and a p-type GaAs cap layer 114 are successively formed.

Figure 2B:
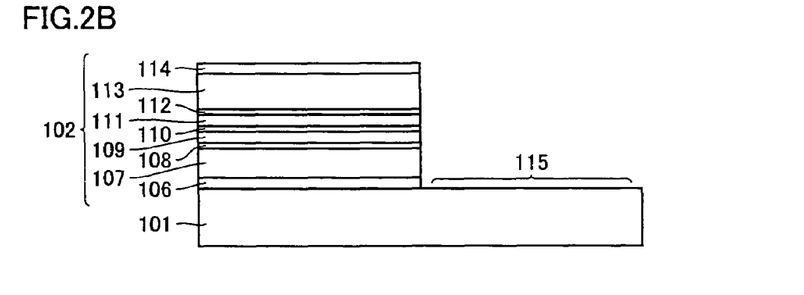

In order to form a semiconductor multilayer structure for a second-wavelength lasing part (hereinafter also referred to as a DVD lasing part) 103, a linear resist pattern (not shown) having a prescribed width is formed on the CD lasing part 102 by photolithography. As shown in FIG. 2B, the p-type GaAs cap layer 114, the p-type $Al_{0.5}Ga_{0.5}As$ second cladding layer 113, the p-type GaAs etching stopper layer 112, the p-type $Al_{0.5}Ga_{0.5}As$ first cladding layer 111, the p-type $Al_{0.3}Ga_{0.7}As$ guide layer 110, the active layer 109, the n-type $Al_{0.3}Ga_{0.7}As$ guide layer 108, the n-type $Al_{0.5}Ga_{0.5}As$ cladding layer 107 and the n-type GaAs buffer layer 106 are wet-etched through a mask of this resist pattern thereby exposing a substrate surface 115 by a prescribed width.

Figure 2C:
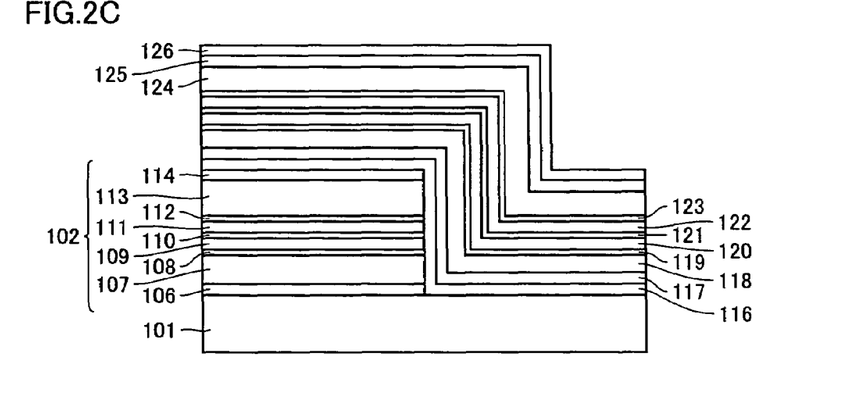
FIG. 2C, showing still another step in the method of fabricating a monolithic multi-wavelength laser device according to the present invention, is a sectional view illustrating formation of a semiconductor multilayer structure for the DVD lasing part.

Referring to FIG. 2C, the semiconductor multilayer structure for the DVD lasing part 103, i.e., an n-type GaAs buffer layer 116, an n-type GaInP buffer layer 117, an n-type $(Al_{0.7}Ga_{0.3})_{0.5}In_{0.5}P$ cladding layer 118, an undoped $(Al_{0.5}Ga_{0.5})_{0.5}P$ guide layer 119, an active layer 120 consisting of an MQW (multiple quantum well) structure, another undoped $(Al_{0.5}Ga_{0.5})_{0.5}In_{0.5}P$ guide layer 121, a p-type $(Al_{0.7}Ga_{0.3})_{0.5}In_{0.5}P$ first cladding layer 122, a p-type GaInP etching stopper layer 123, a p-type $(Al_{0.7}Ga_{0.3})_{0.5}In_{0.5}P$ second cladding layer 124, a p-type GaInP intermediate layer 125 and a p-type GaAs cap layer 126 are successively formed on the exposed substrate surface 115 by MBE (molecular beam epitaxy).

Figure 2D:
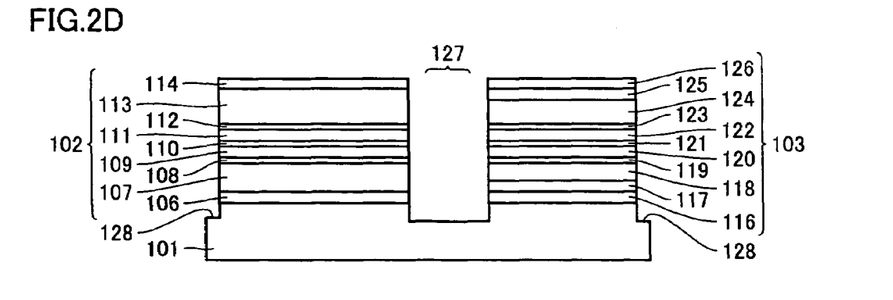
FIG. 2D, showing a further step in the method of fabricating a monolithic multi-wavelength laser device according to the present invention, is a sectional view illustrating formation a lasing part isolation trench.

Referring to FIG. 2D, unnecessary portions of the semiconductor multilayer structure for the DVD lasing part 103 formed on the semiconductor multilayer structure for the CD lasing part 102 are removed by photolithography and wet etching. At the same time, a lasing part isolation trench 127 reaching the substrate 101 is formed to electrically isolate the CD lasing part 102 and the DVD lasing part 103 from each other along with formation of chip dividing trenches 128.

Figure 3A:
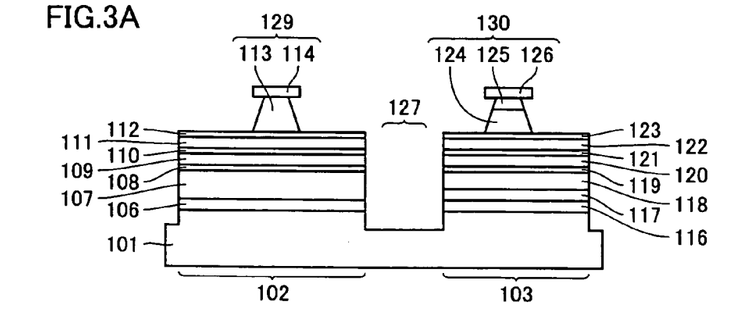
FIG. 3A, showing a further step in the method of fabricating a monolithic multi-wavelength laser device according to the present invention, is a sectional view showing formation of shaped ridge portions.

Referring to FIG. 3A, a linear $SiO_2$ mask (not shown) having a width of 3 to 4 μm is thereafter formed on the p-type GaAs cap layers 114 and 126 of the CD and DVD lasing parts 102 and 103. The p-type second cladding layer 113 and the p-type cap layer 114 of the CD lasing part 102 as well as the p-type second cladding layer 124, the p-type GaInP intermediate layer 125 and the p-type Gaks cap layer 126 of the DVD lasing part 103 are worked into prescribed ridge widths by dry etching, and resulting ridge portions 129 and 130 are shaped by wet etching.

Figure 3B:
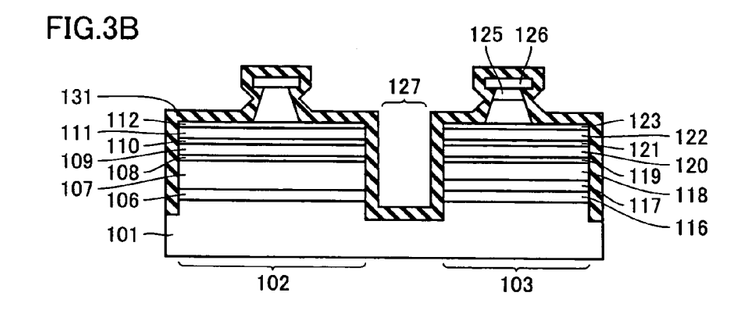
FIG. 3B, showing a further step in the method of fabricating a monolithic multi-wavelength laser device according to the present invention, is a sectional view illustrating formation of current blocking layers.

Referring to FIG. 3B, an n-type GaAs current blocking layer 131 having a thickness of 0.1 μm is formed by MOCVD to fill up the side surfaces of the ridge portions 129 and 130 of the CD and DVD lasing parts 102 and 103 respectively.

Figure 3C:
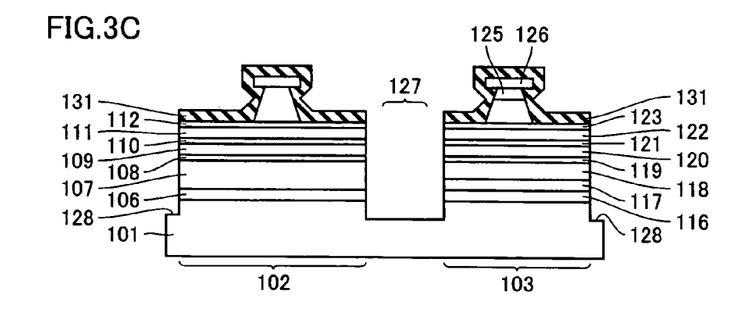
FIG. 3C, showing a further step in the method of fabricating a monolithic multi-wavelength laser device according to the present invention, is a sectional view illustrating the current blocking layers partially removed by wet etching.

Referring to FIG. 3C, a resist pattern (not shown) having linearly opening windows on the trench 127 electrically isolating the CD lasing part 102 and the DVD lasing part 103 from each other and the chip dividing trenches 128 respectively is formed on the CD and DVD lasing parts 102 and 103 by photolithography. Portions of the n-type GaAs current blocking layer 131 located on the trenches 127 and 128 are removed by wet etching.

Figure 3D:
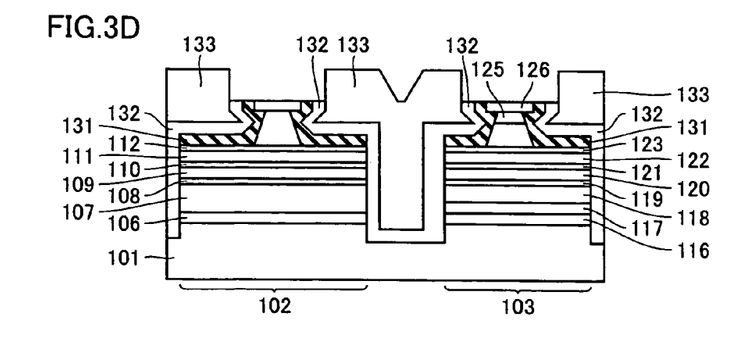
FIG. 3D, showing a further step in the method of fabricating a monolithic multi-wavelength laser device according to the present invention, is a sectional view illustrating formation of insulating dielectric thin films and a resist pattern.

Referring to FIG. 3D, the resist pattern is removed and an insulation layer 132 consisting of an insulating dielectric thin film having a low refractive index of 1 to 2, such as a silicon nitride ($SiN_x$) protective film, is formed on the remaining n-type GaAs current blocking layers 131 by plasma CVD (chemical vapor deposition), for example. At this time, the N composition of the surface layer can be set to not more than 0.001% by adjusting the final film forming condition for the dielectric thin film. Alternatively, an Si film may be formed by sputtering after forming the ($SiN_x$) protective film.

A resist pattern 133 having linear openings immediately above the ridge portions 129 and 130 of the CD and DVD lasing parts 102 and 103 respectively is formed on the insulation layer 132 consisting of the insulating dielectric thin film. Portions of the insulation layer 132 consisting of the insulating dielectric thin film located under the openings are removed with a buffered hydrofluoric acid solution, while portions of the n-type GaAs current blocking layers 131 located under the openings are removed with a sulfuric acid etchant. As to the insulation layer 132 consisting of the insulating dielectric thin film, which may alternatively consist of an $SiO_2$ film formed by plasma CVD, the film forming temperature must be noticed.

The lower limit for this film forming temperature must be at least 150° C., in order to ensure the refractive index and strength of the insulation layer 132 consisting of the insulating dielectric thin film. The upper limit for the film forming temperature is preferably lower than the growth temperature for the semiconductor layers, more specifically not more than 400° C., in order to prevent rediffusion of impurities contained in the semiconductor layers.

Further, the thermal expansion coefficients of the insulating dielectric thin films and the semiconductor multilayer films are so different from each other that the insulating dielectric thin films may be separated if the film forming temperature therefor is excessively high. In order to prevent such separation, the insulating dielectric thin films are preferably formed at a substrate temperature of not more than 250° C.

Figure 4A:
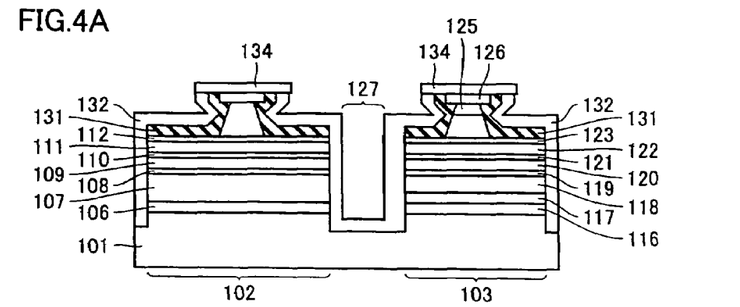
FIG. 4A, showing a further step in the method of fabricating a monolithic multi-wavelength laser device according to the present invention, is a sectional view illustrating formation of p-side alloy electrodes.

Thereafter Au/AuZn is evaporated by electron-beam evaporation, the resist pattern 133 is separated with an organic solvent, and p-side alloy electrodes 134 are formed on the p-type cap layers 114 and 126 of the CD and DVD lasing parts 102 and 103, as shown in FIG. 4A.

Figure 4B:
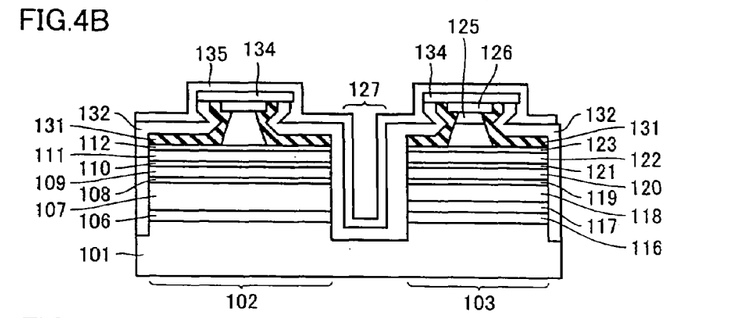
FIG. 4B, showing a further step in the method of fabricating a monolithic multi-wavelength laser device according to the present invention, is a sectional view illustrating formation of inner metal electrode layers.

As shown in FIG. 4B, inner metal electrode layers 135 are thereafter formed on the p-side alloy electrodes 134 and the insulation layers 132 consisting of the insulating dielectric thin films. According to Example 1, the inner metal electrode layers 135 consist of Mo/Au electrodes formed by sputtering.

Figure 4C:
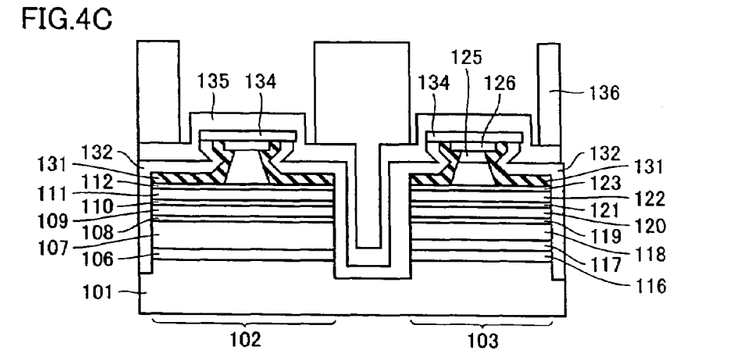
FIG. 4C, showing a further step in the method of fabricating a monolithic multi-wavelength laser device according to the present invention, is a sectional view illustrating formation of a resist pattern on the inner metal electrode layers.

As shown in FIG. 4C, a resist pattern 136 having rectangular openings on the CD and DVD lasing parts 102 and 103 respectively are formed on the inner metal electrode layers 135.

Figure 4D:
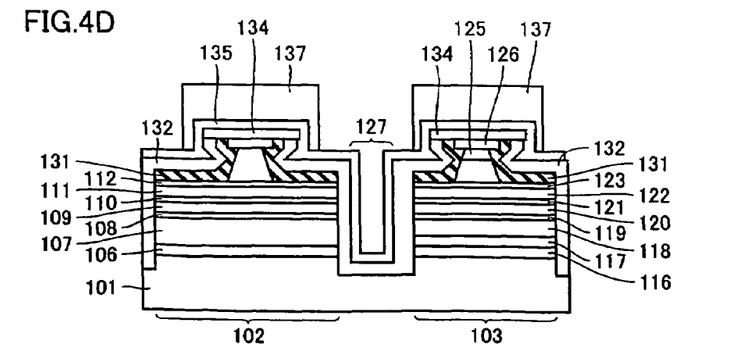
FIG. 4D, showing a further step in the method of fabricating a monolithic multi-wavelength laser device according to the present invention, is a sectional view illustrating formation of outer metal electrode layers.

As shown in FIG. 4D, Au outer metal electrode layers 137 are formed only on the openings through the mask of the resist pattern 136.

The Au outer metal electrode layers 137, insufficient in heat dissipativity upon mounting in an experimental view if the thickness thereof is less than 1 μm, must be 2 to 3 μm in thickness. Further, the Au outer metal electrode layers 137, which can be formed by electroless or electrolytic plating, are formed by electrolytic plating since it is difficult to plate metal layers of at least 1 Jim in thickness by electroless plating requiring no metal underlayers. The Au outer metal electrode layers 137 are formed only on regions fed with current by electrolytic plating, and hence underlayers must be uniformly and completely covered with metal films.

Portions around the necks of the side surfaces of the ridge portions 129 and 130 are so easily shadowed that it may be difficult to cover the inner metal electrode layers 135 depending on the method of forming the same. Therefore, the inner metal electrode layers 135 must be formed by a method such as sputtering or CVD, for example, capable of also covering shadowed portions.

While the Mo/Au electrodes formed by sputtering are employed as the inner metal electrode layers 135 in Example 1, the inner metal electrode layers 135 may alternatively be prepared from Ti/Al electrodes similarly formed by sputtering.

Figure 5A:
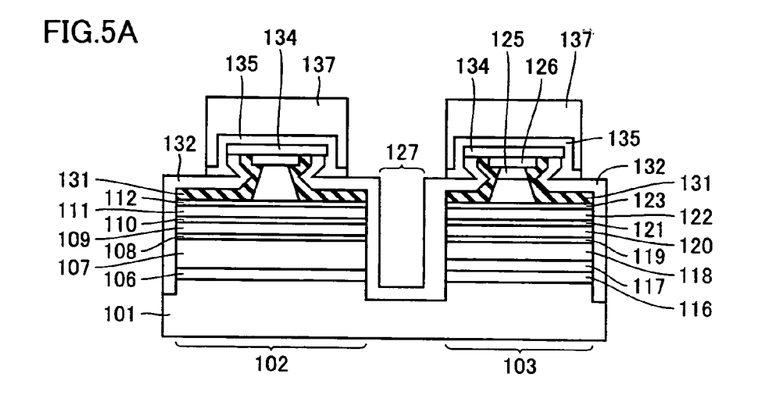
FIG. 5A, showing a further step in the method of fabricating a monolithic multi-wavelength laser device according to the present invention, is a sectional view illustrating the inner metal electrode layers partially removed except portions located immediately under the outer metal electrode layers.

Finally, portions of the inner metal electrode layers 135 located on portions, such as the chip dividing trenches 127 and the isolation trench 128, other than those located immediately under the Au outer metal electrode layers 137 are removed by wet etching through masks of the Au outer metal electrode layers 137, as shown in FIG. 5A.

Figure 5B:
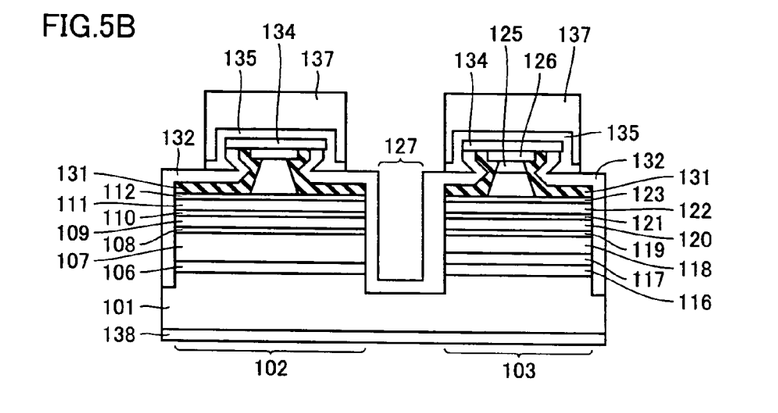
FIG. 5B, showing a further step in the method of fabricating a monolithic multi-wavelength laser device according to the present invention, is a sectional view illustrating formation of an n-type ohmic electrode on the back surface of the substrate.

As shown in FIG. 5B, the obtained wafer is polished from the back surface of the substrate 101 so that the thickness thereof is about 100 μm, and an n-side ohmic electrode 138 is formed on the back surface of the substrate 101.

A wafer formed with two-wavelength lasing parts according to the aforementioned Example 1 was divided into a plurality of bars, each of which was coated with reflecting films on end surfaces and thereafter divided into chips. These chips were mounted on a stem and subjected to measurement of laser device characteristics.

Consequently, a CD lasing part of each chip exhibited an oscillation wavelength of 782 nm and an operating current of 30 mA at an optical output of 5 mW. A DVD lasing part exhibited an oscillation wavelength of 656 nm and an operating current of 50 mA at an optical output of 4 mW. In relation to reliability, this chip ran at least 1000 hours.

When relative noise field intensity (RIN) at an optical output of 5 mW was measured with a quantity of return light in the range of 0.01 to 10%, both of the CD and DVD lasing parts exhibited excellent noise characteristics of not more than −130 dB/Hz at temperatures of 25° C. and 70° C.

EXAMPLE 2

A monolithic two-wavelength semiconductor laser device according to Example 2 of the present invention is different from that according to Example 1 only in a point that the width of an opening of a resist pattern 133 located on a ridge portion 130 of a DVD lasing part 103 is increased while no insulation layers 132 consisting of insulating dielectric thin films are formed on n-type GaAs current blocking layers 131 in FIG. 3D. In the DVD lasing part 103 of the semiconductor laser device according to Example 2, superior heat dissipativity was attained to improve reliability of the laser device as compared with Example 1 due to absence of the insulating dielectric thin films having lower thermal conductivity than semiconductor crystals.

The inclined n-type GaAs substrate 101 having the main surface inclined at the offset angle of 15° from the (001) plane in the [110] orientation is employed in each of the aforementioned Examples, in order to adjust the oscillation wavelength of the DVD lasing part 103 to around 650 nm satisfying the DVD standard and improve crystallinity of the CD and DVD lasing parts 102 and 103.

The offset angle must be set to at least 5° in order to adjust the oscillation wavelength of the DVD lasing part 103, while the offset angle must be set to about 5 to 25°, more preferably 10 to 20°, in order to improve the crystallinity of the CD and DVD lasing parts 102 and 103. Further preferably, excellent laser device characteristics can be implemented by employing an inclined substrate having an offset angle of 13 to 18°.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A monolithic multi-wavelength laser device comprising:
   a substrate;
   a first-wavelength lasing part having a ridge portion; and
   a second-wavelength lasing part having a ridge portion, wherein
   each of said first-wavelength lasing part and said second-wavelength lasing part comprises:
      a current blocking layer comprising a semiconductor thin film and covering a side surface of a corresponding ridge portion and bending to extend away from the corresponding ridge portion along a plane on which the corresponding ridge portion stands, and
      an insulation layer comprising an insulating dielectric thin film, covering said current blocking layer and made of a material having a lower refractive index than said current blocking layer, a surface portion of said insulation layer has an oxygen concentration and/or a nitrogen concentration in the range of 0 to 0.00 1, and a thickness of said insulation layer is in the range of 0.05 µm to 0.2 µm, and the thin film of the current blocking layer contains at least one material selected from a group consisting of GaAs, α-Si and Ge.

2. The monolithic multi-wavelength laser device according to claim 1, further comprising a p-side electrode comprising an inner metal electrode layer and an outer metal electrode layer, wherein said inner metal electrode layer is in contact with part of said insulation layer, and said outer metal electrode layer covers said inner metal electrode layer.

3. The monolithic multi-wavelength laser device according to claim 2, wherein said inner metal electrode layer covers the entire surface of said insulation layer in the laser beam emission direction.

4. The monolithic multi-wavelength laser device according to claim 2, wherein said inner metal electrode layer contains an Mo/Au alloy and/or a Ti/Al alloy.

5. The monolithic multi-wavelength laser device according to claim 2, wherein said outer metal electrode layer comprises Au.

6. The monolithic multi-wavelength laser device according to claim 1, wherein the thickness of said current blocking layer is in the range of 0.05 µm to 0.2 µm.

7. The monolithic multi-wavelength laser device according to claim 1, wherein said insulation layer comprises an insulating dielectric thin film containing at least one material selected from a group consisting of a silicon oxide, a silicon nitride and a mixture of a silicon oxide and a silicon nitride.

8. The monolithic multi-wavelength laser device according to claim 1, wherein said substrate comprises GaAs.

9. The monolithic multi-wavelength laser device according to claim 1, wherein said substrate has an offset angle in the range of 5 to 25° from the (001) plane in the [110] orientation.

10. A method of fabricating a monolithic multi-wavelength laser device, comprising:

providing a substrate;

forming a first ridge portion and a second ridge portion on the substrate;

forming a current blocking layer comprising a semiconductor thin film containing at least one material selected from a group consisting of GaAs, α-Si and Ge so as to cover a side surface of each of the ridge portions and to bend to extend away from the ridge portion along a plane on which the ridge portions stand; and forming, at a temperature range of 150 to 400° C., an insulation layer comprising an insulating dielectric thin film having a lower refractive index than the current blocking layer so as to cover the current blocking layer, wherein the formation of the insulation layer is such that a surface portion of said insulation layer has an oxygen concentration and/or a nitrogen concentration in the range of 0 to 0.001 and a thickness of said insulation layer is in the range of 0.05 µm to 0.2 µm.

11. The method of fabricating the monolithic multi-wavelength laser device according to claim 10, further comprising forming an inner metal electrode layer over the insulation layer, and forming an outer metal electrode layer over the inner metal layer.

12. The method of fabricating the monolithic multi-wavelength laser device according to claim 11, wherein the outer metal electrode layer is formed by electrolytic plating.

13. The method of fabricating the monolithic multi-wavelength laser device according to claim 10, wherein the insulation layer is formed at a temperature range of 150 to 250° C.

* * * * *